United States Patent [19]

Sugawara

[11] Patent Number: 5,689,197

[45] Date of Patent: Nov. 18, 1997

[54] BIMOS-TYPE CURRENT SWITCH APPARATUS

[75] Inventor: Mitsutoshi Sugawara, Tokyo, Japan

[73] Assignee: NEC Corporation, Tokyo, Japan

[21] Appl. No.: 569,691

[22] Filed: Dec. 8, 1995

[30] Foreign Application Priority Data

Dec. 8, 1994 [JP] Japan .................................. 6-305132

[51] Int. Cl.$^6$ .................................................. H03K 19/01
[52] U.S. Cl. ............................ 326/110; 326/84; 326/115
[58] Field of Search ........................ 326/64, 66, 84–85, 326/101, 109, 110, 115, 127; 257/370, 378

[56] References Cited

U.S. PATENT DOCUMENTS

| | | | |
|---|---|---|---|
| 4,829,200 | 5/1989 | Downey | 326/109 |
| 5,006,730 | 4/1991 | Davis | 326/110 |
| 5,430,398 | 7/1995 | Cooper et al. | 326/109 X |

*Primary Examiner*—David R. Hudspeth
*Attorney, Agent, or Firm*—Foley & Lardner

[57] ABSTRACT

A current switch apparatus includes a bipolar transistor controlled by a reference voltage, a MOS transistor controlled by a logic signal, and a constant current source connected to the bipolar transistor and the MOS transistor.

33 Claims, 19 Drawing Sheets

N-CHANNEL

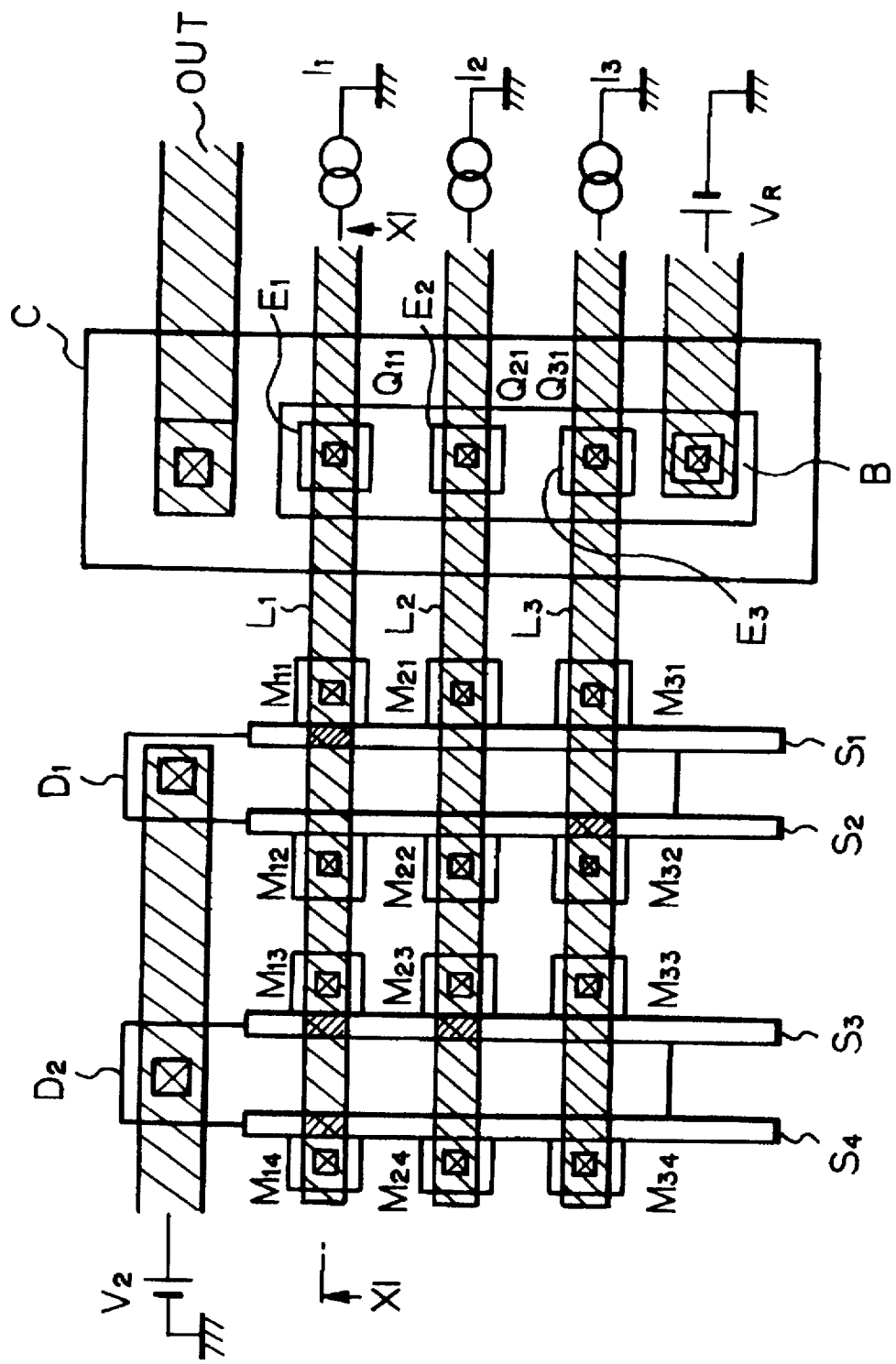

BIMOS-TYPE CURRENT SWITCH APPARATUS

BACKGROUND OF THE INVENTION

1. Field of the Invention

The present invention relates to a current switch apparatus, and more particularly, a BiMOS-type current switch apparatus.

2. Description of the Related Art

A prior art current switch apparatus includes a first bipolar transistor controlled by a reference voltage, a second bipolar transistor controlled by a logic signal, and a constant current source connected to emitters of the bipolar transistors. For example, when the voltage of the logic signal is higher than the reference voltage, the first bipolar transistor is turned OFF and the second bipolar transistor is turned ON. Contrary to this, when the voltage of the logic signal is lower than the reference voltage, the first bipolar transistor is turned ON and the second bipolar transistor is turned OFF. Thus, various logic circuits can be realized by using the current switch apparatus. This will be explained later in detail.

In the above-described prior art current switch apparatus, however, when the voltage of the logic signal is too high, the second bipolar transistor is saturated, thereby reducing the speed of a switching operation. Also, in this case, a large reverse bias voltage is applied to the first bipolar transistor, thereby breaking down the first bipolar transistor. Therefore, an upper limit of the voltage of the logic signal cannot be large.

Generally, in order to avoid the breakdown of the first bipolar transistor, the logic signal is supplied via a level shifter to the second bipolar transistor. This, however, increases the size of the current switch apparatus, and therefore, the integration is reduced. Also, the manufacturing cost is increased.

SUMMARY OF THE INVENTION

It is an object of the present invention to provide a current switch apparatus which can be operated directly by a logic signal whose level can be greatly swung.

According to the present invention, a current switch apparatus includes a bipolar transistor controlled by a reference voltage, a MOS transistor controlled by a logic signal, and a constant current source connected to the bipolar transistor and the MOS transistor.

BRIEF DESCRIPTION OF THE DRAWINGS

The present invention will be more clearly understood from the description as set forth below, in comparison with the prior art, with reference to the accompanying drawings, wherein:

FIG. 11B is a plan view of the circuit of FIG. 11A; and

DESCRIPTION OF THE PREFERREED EMBODIMENTS

Before the description of the preferred embodiments, a prior art current switch apparatus will be explained with reference to FIGS. 1 and 2.

Figure 1:
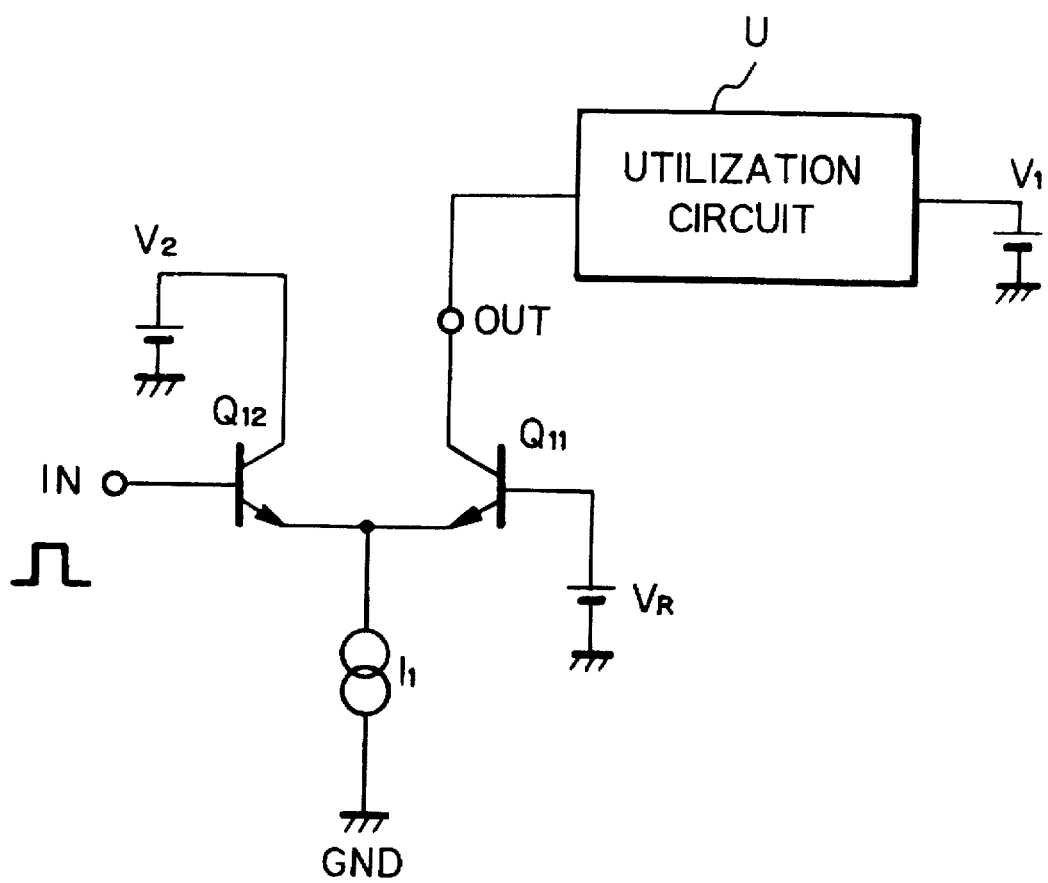
FIG. 1 is a circuit diagram illustrating a prior art current switch apparatus.

In FIG. 1, two NPN type transistors $Q_{11}$ and $Q_{12}$ are commonly connected to a constant current source $I_1$. That is, emitters of the NPN type transistors $Q_{11}$ and $Q_{12}$ are connected to the constant current source $I_1$. Note that a current of the constant current source $I_1$ is also defined by $I_1$. The collector of the NPN type transistor $Q_{11}$ is connected to an output terminal OUT from a utilization circuit or an external circuit U. The utilization circuit U receives a voltage $V_1$. Also, a reference voltage $V_R$ is applied to the base of the transistor $Q_{11}$. On the other hand, the collector of the NPN type transistor $Q_{12}$ receives a voltage $V_2$, and a logic signal IN is applied to the base thereof.

For example, when the voltage of the logic signal IN is higher than the reference voltage $V_R$, the NPN type transistor $Q_{11}$ is turned OFF and the NPN type transistor $Q_{12}$ is turned ON, so that a current equivalent to $I_1$ does not flow through the utilization circuit U. Contrary to this, when the voltage of the logic signal IN is lower than the reference voltage $V_R$, the NPN type transistor $Q_{11}$ is turned ON and the NPN type transistor $Q_{12}$ is turned OFF, so that a current equivalent to $I_1$ flows through the utilization circuit U.

In the current switch apparatus of FIG. 1, however, if the voltage of the logic signal IN is too high, for example, higher than $V_2$, the NPN type transistor $Q_{12}$ is saturated which reduces the speed of a switching operation. Also, in this case, the following large reverse bias voltage is applied to the NPN type transistor $Q_{11}$:

$$V_{IN} - V_{BE} - V_R$$

where $V_{IN}$ is a voltage of the logic signal; and $V_{BE}$ is a base-to-emitter voltage of the NPN type transistor $Q_{11}$. For example, if $V_{IN}$=5V, $V_{BE}$=0.7V and $V_R$=1.4V, the reverse bias voltage applied to the base-to-emitter of the NPN type transistor $Q_{11}$ is 2.9V, thereby breaking down the NPN type transistor $Q_{11}$, provided that the apparatus is manufactured by using a fine photolithography process.

In order to avoid the breakdown of the NPN type transistor $Q_{11}$, a level shifter is provided for reducing the voltage of the logic signal IN. That is, a circuit including level shifters is illustrated in FIG. 2. In FIG. 2, reference numeral 1 designates a programmable logic array (PLA) including three logic circuits $G_1$, $G_2$ and $G_3$, 2 designates a level shift circuit including three level shifters 2-1, 2-2 and 2-3 powered by GND and $V_3$, and 3 designates a digital/analog (D/A) converter including three current switches 3-1, 3-2 and 3-3 formed by NPN type transistors $Q_{11}$, $Q_{12}$, $Q_{21}$, $Q_{22}$, $Q_{31}$ and $Q_{32}$. In this case, the output voltage of each of the level shifters 2-1, 2-2 and 2-3 is 0 or $V_3$. Therefore, if the voltage $V_3$ is set at an appropriate value, too high a voltage is never applied to the bases of NPN type transistors $Q_{12}$, $Q_{22}$ and $Q_{32}$, so that the NPN type transistors $Q_{11}$, $Q_{21}$ and $Q_{31}$ are hardly broken down.

Figure 2:
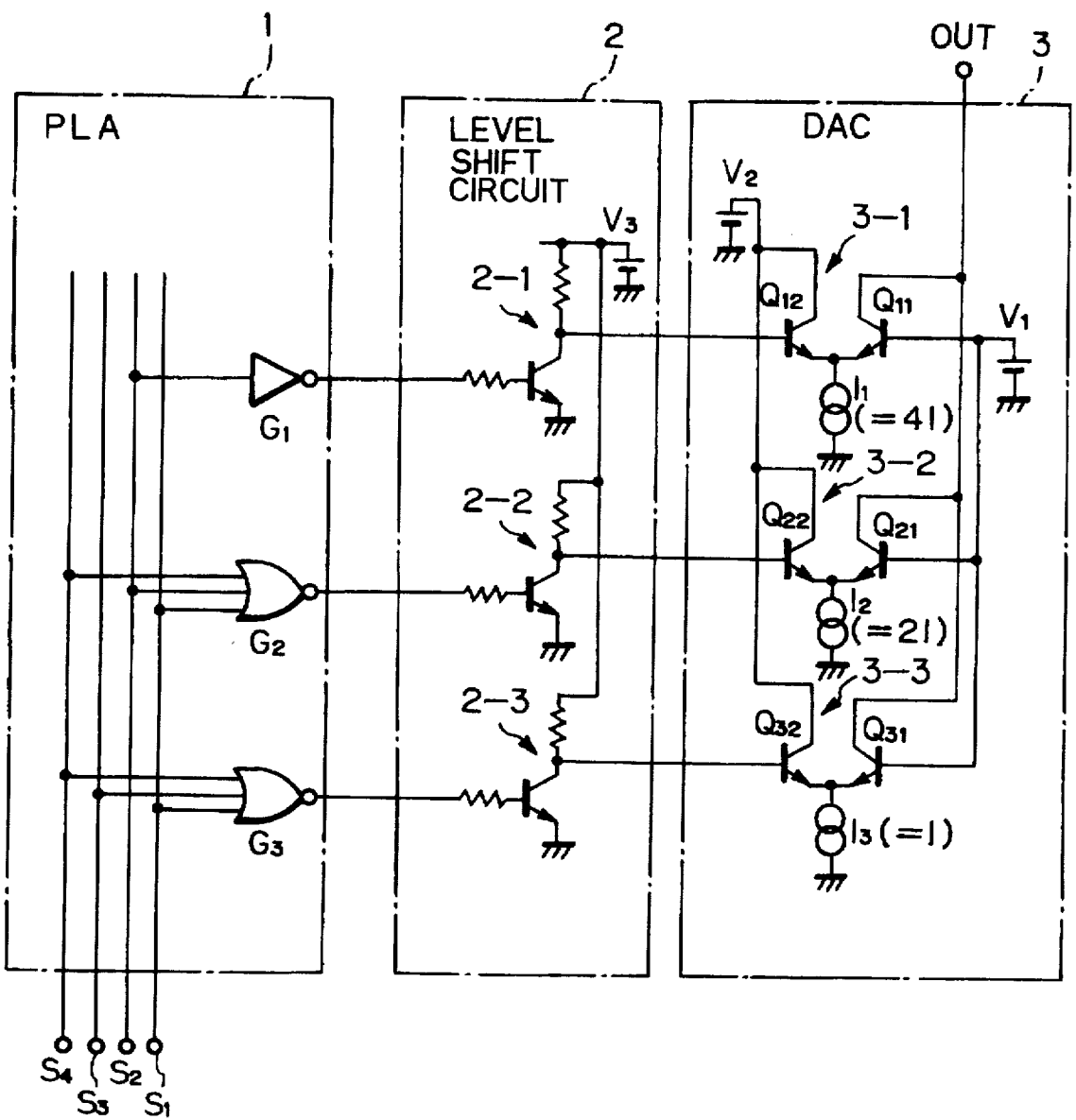
FIG. 2 is a circuit diagram illustrating a circuit including the current switch apparatus of FIG. 1.

Note that, in the circuit of FIG. 2, where $I_1$=$2^2$I, $I_2$=2I and $I_3$=I, if $S_1$="1" and $S_2$=$S_3$=$S_4$="0", a current of 4I flows through an output terminal OUT. If $S_2$="1" and $S_1$=$S_3$=$S_4$="0", a current of I flows through the output terminal OUT. If $S_3$="1" and $S_1$=$S_2$=$S_4$="0", a current of 6I flows through the output terminal OUT. If $S_4$="1" and $S_1$=$S_2$$S_3$="0", a current of 4I flows through the output terminal OUT.

Thus, the presence of the level shift circuit 2 increases the size of the circuit of FIG. 2, and therefore, the integration is reduced. Also, the manufacturing cost is increased.

Figure 3:
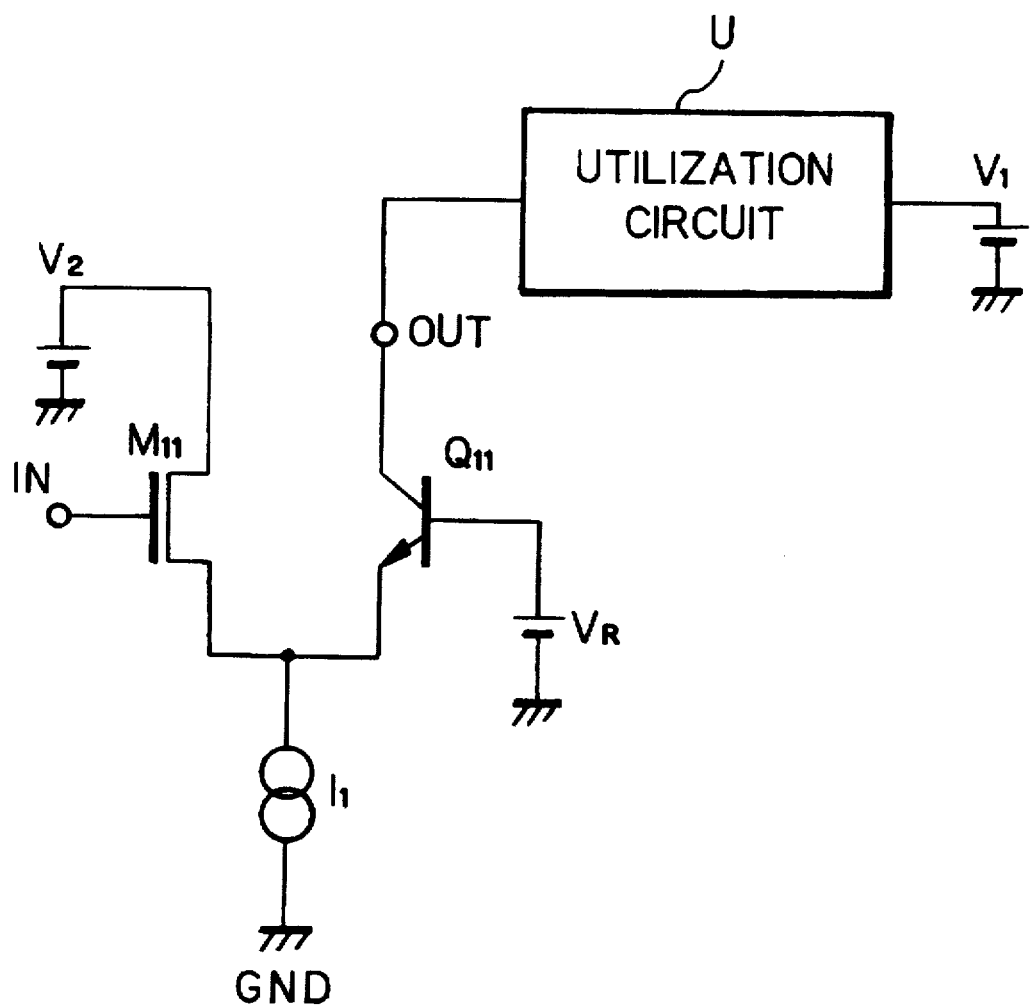
FIG. 3 is a circuit diagram illustrating a first embodiment of the current switch apparatus according to the present invention.
Figure 3:
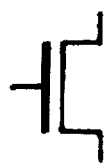

In FIG. 3, which illustrates a first embodiment of the present invention, an N-channel MOS transistor $M_{11}$ is provided instead of the NPN type transistor $Q_{12}$ of FIG. 1.

In FIG. 3, when $V_{IN}$<$V_R$–$V_{BE}$, the gate-to-source voltage of the MOS transistor $M_{11}$ is negative, so that the MOS transistor $M_{11}$ is surely turned OFF. As a result, the NPN type transistor $Q_{11}$ is turned ON, so that a current of $I_1$ flows through the output terminal OUT, i.e., the utilization circuit U.

In FIG. 3, when $V_R$–$V_{BE}$<$V_{IN}$≦$V_2$, the MOS transistor $M_{11}$ is operated in a saturated state, and as a result, the following condition is satisfied;

$$I=\beta/2\cdot(V_{GS}-V_{TH})^2$$

where I is a current flowing through the MOS transistor $M_{11}$;

β is a current amplification factor of the MOS transistor $M_{11}$;

$V_{GS}$ is a gate-to-source voltage of the MOS transistor $M_{11}$; and $V_{TH}$ is a threshold voltage of the MOS transistor $M_{11}$. In this case, if $V_{IN}$–$V_{GS}$>$V_R$–$V_{BE}$+0.1, then, the NPN transistor $Q_{11}$ is surely turned OFF, so that a current of $I_1$ flows through the MOS transistor $M_{11}$. Concretely, if $V_R$=1.4V and $V_{IN}$>2V, the NPN type transistor $Q_{11}$ is surely turned OFF, and as a result, a current of $I_1$ flows through the MOS transistor $M_{11}$.

In FIG. 3, when $V_{IN}$>$V_2$+$V_{GS}$, the MOS transistor $M_{11}$ is operated in a triode region, so that the following condition is satisfied:

$$I_1=\beta(V_{GS}-V_{TH})V_{DS}-\beta/2\cdot V_{DS}$$

where $V_{DS}$ is a drain-to-source voltage of the MOS transistor $M_{11}$. As a result, a voltage of $V_2$–$V_{DS}$ is generated at the source of the MOS transistor $M_{11}$, i.e., at the emitter of the NPN type transistor $Q_{11}$.

Therefore, the value β dependent upon the size of the MOS transistor $M_{11}$ is set, that is, the voltage $V_{DS}$ is set at a value between 0V and 1V, for example. Then, the voltage $V_2$ is set so that the voltage of $V_2$–$V_{DS}$ at the source of the MOS transistor $M_{11}$ turns OFF the NPN type transistor $Q_{11}$ and avoids the base-emitter breakdown of the NPN type transistor $Q_{11}$.

Thus, in FIG. 3, even when the logic signal IN having an amplitude of a MOS level from 0V to 5V is applied directly to the gate of the MOS transistor $M_{11}$, no problem occurs.

Figure 4:
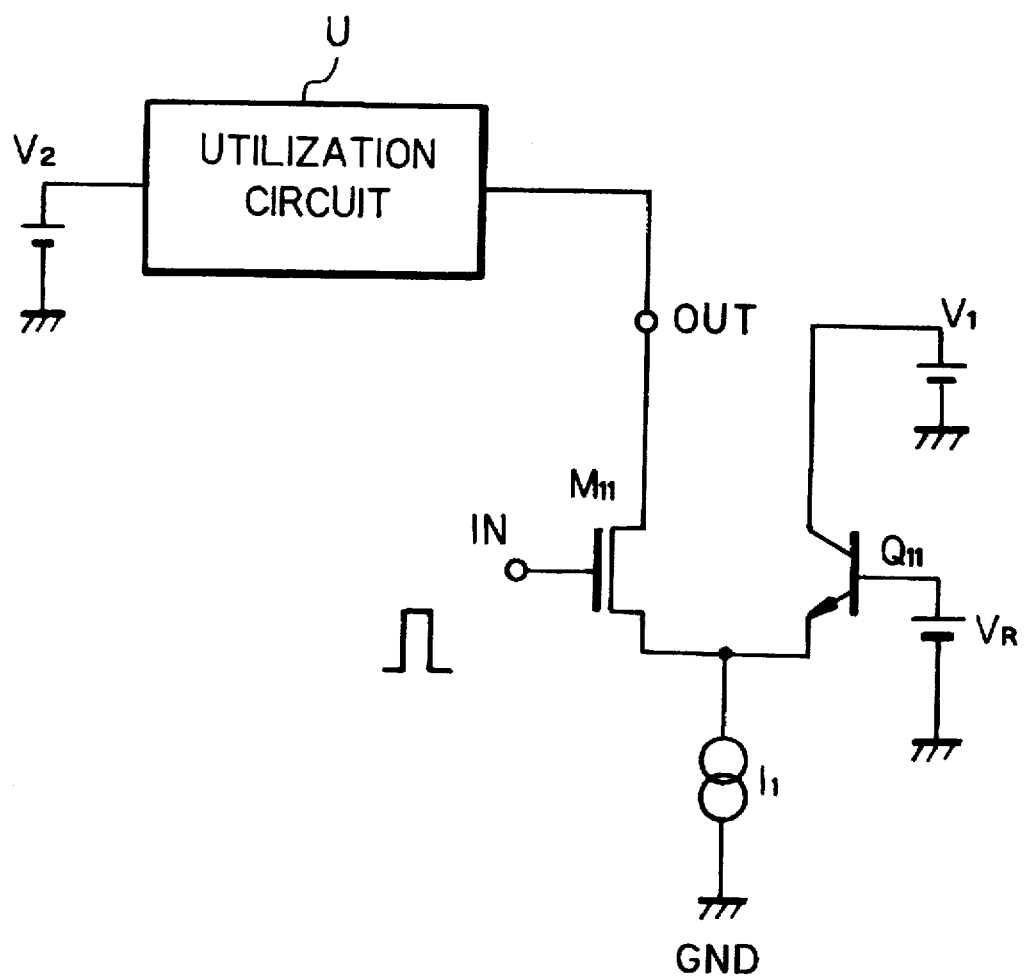
FIG. 4 is a circuit diagram illustrating a second embodiment of the current switch apparatus according to the present invention.

In FIG. 4, which illustrates a second embodiment of the present invention, the output terminal OUT and the utilization circuit U of FIG. 3 is connected to the drain of the MOS transistor $M_{11}$, and the voltage $V_1$ is applied directly to the collector of the NPN type transistor $Q_{11}$ of FIG. 3. The apparatus of FIG. 4 operates in the same way as that of FIG. 3.

Figure 5:
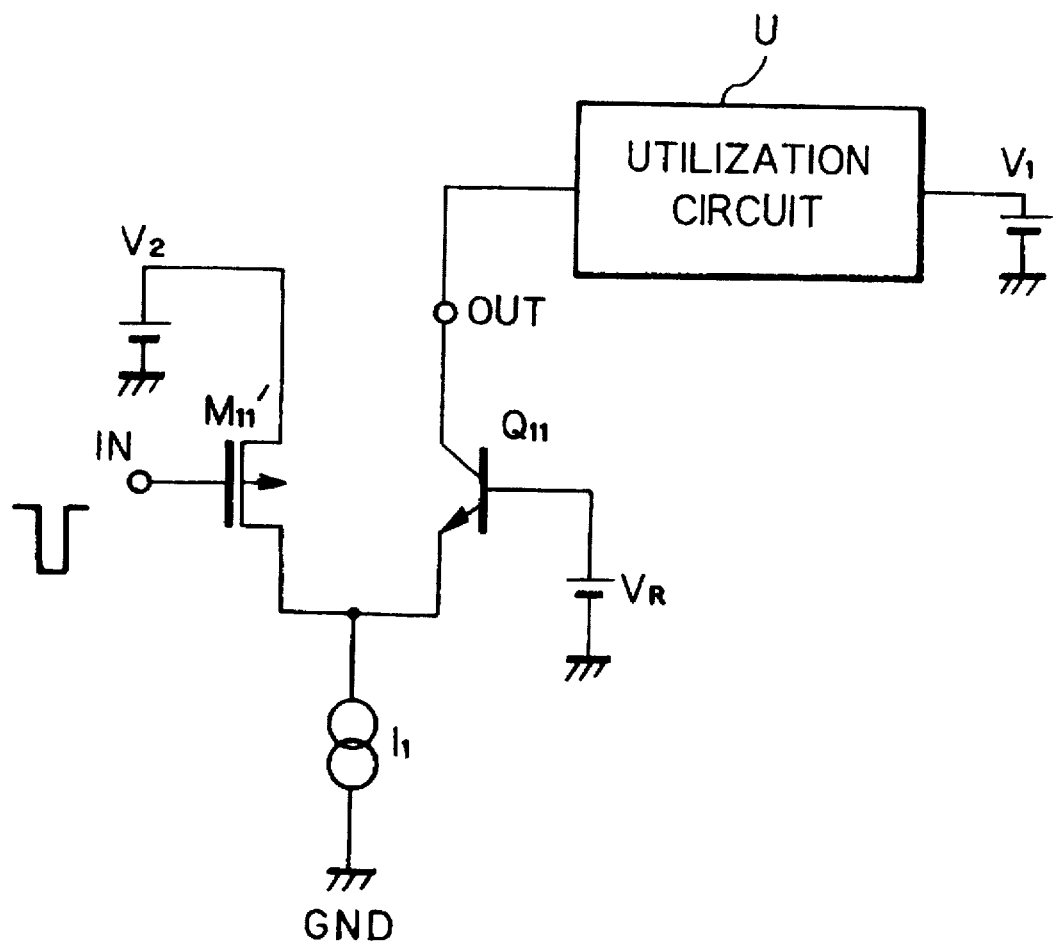
FIG. 5 is a circuit diagram illustrating a third embodiment of the current switch apparatus according to the present invention.
Figure 5:
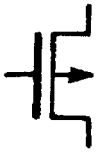

In FIG. 5, which illustrates a third embodiment of the present invention, a P-channel MOS transistor $M_{11}'$ is provided instead of the N-channel MOS transistor $M_{11}$ of FIG. 3. In this case, a source of the MOS transistor $M_{11}'$ receives the voltage $V_2$, and a drain of the MOS transistor $M_{11}'$ is connected to the constant current source $I_1$.

In FIG. 5, when $V_{IN}$>$V_2$, the gate-to-source voltage of the MOS transistor $M_{11}'$ is negative, so that the MOS transistor $M_{11}'$ is surely turned OFF. As a result, the NPN type transistor $Q_{11}$ is turned ON, so that a current of $I_1$ flows through the output terminal OUT, i.e., the utilization circuit U.

In FIG. 5, when $V_{IN}$ is sufficiently low, the MOS transistor $M_{11}'$ is operated in a triode region. As a result, in the same way as in FIG. 3, a voltage of $V_2$–$V_{DS}$ is generated at the source of the MOS transistor $M_{11}'$, i.e., at the emitter of the NPN type transistor $Q_{11}$.

Therefore, the value β dependent upon the size of the MOS transistor $M_{11}'$ is set, that is, the voltage $V_{DS}$ is set at a value between 0V and 1V, for example. Then, the voltage $V_2$ is set so that the voltage of $V_2$–$V_{DS}$ at the drain of the MOS transistor $M_{11}'$ turns OFF the NPN type transistor $Q_{11}$ and avoids the base-emitter breakdown of the NPN type transistor $Q_{11}$.

Thus, in FIG. 5, even when the logic signal IN having an amplitude of a MOS level from 0V to 5V is applied directly to the gate of the MOS transistor $M_{11}'$, no problem occurs.

Figure 6:
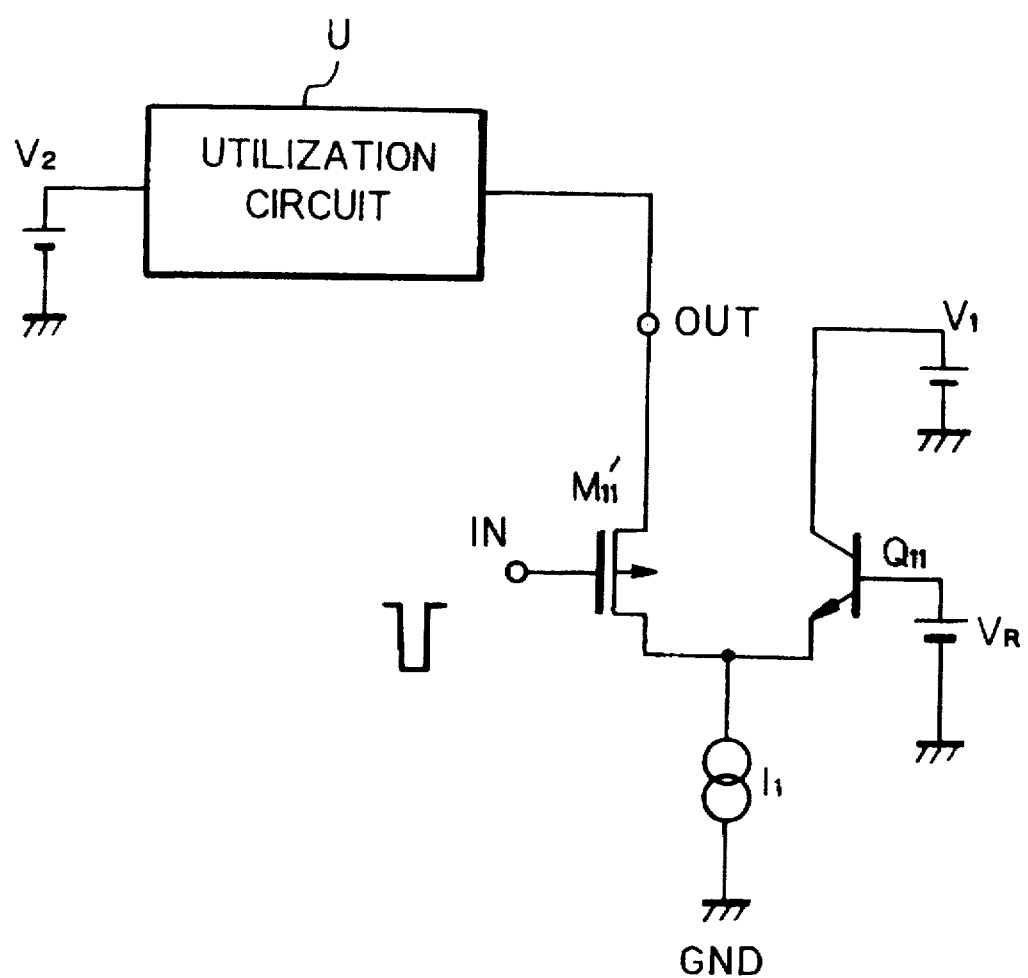
FIG. 6 is a circuit diagram illustrating a fourth embodiment of the current switch apparatus according to the present invention.

In FIG. 6, which illustrates a fourth embodiment of the present invention, the output terminal OUT and the utilization circuit U of FIG. 5 is connected to the source of the MOS transistor $M_{11}'$, and the voltage $V_1$ is applied directly to the collector of FIG. $Q_{11}$ of FIG. 5. The apparatus of FIG. 6 operates in the same way as that of FIG. 5.

Figure 7A:
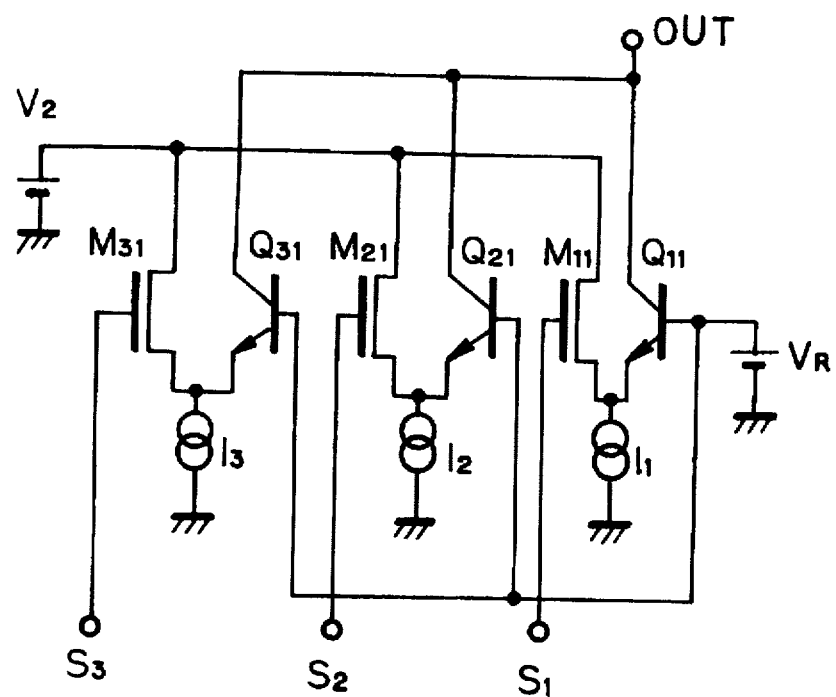
FIGS. 7A, 7B, 7C and 7D are circuit diagrams illustrating a digital/analog (D/A) converter to which the present invention is applied.

FIG. 7A illustrates a D/A converter to which the first embodiment as illustrated in FIG. 3 is applied. That is, a current switch formed by an NPN type transistor $Q_{11}$, an N-channel MOS transistor $M_{11}$ and a constant current source $I_1$, a current switch formed by NPN type transistor $Q_{21}$, an N-channel MOS transistor $M_{21}$ and a constant current source $I_2$, a current switch formed by an NPN type transistor $Q_{31}$, an N-channel MOS transistor $M_{31}$ and a constant current source $I_3$, are provided. Collectors of the NPN type transistors $Q_{11}$, $Q_{21}$ and $Q_{31}$ are connected to an output terminal OUT, and bases of the NPN transistors $Q_{11}$, $Q_{21}$ and $Q_{31}$ receive a reference voltage $V_R$. On the other hand, drains of the MOS transistors $M_{11}$, $M_{21}$ and $M_{31}$ receive a voltage $V_2$, and gates of the MOS transistors $M_{11}$, $M_{21}$ and $M_{31}$ receive logic signals $S_1$, $S_2$ and $S_3$, respectively.

In FIG. 7A, when all the logic signals $S_1$, $S_2$ and $S_3$ are active (high), no current flows through the output OUT.

In FIG. 7A, when only the logic signal $S_1$ is inactive (low), a current of $I_1$ flows through the output terminal OUT. Also, when only the logic signal $S_2$ is inactive (low), a current of $I_2$ flows through the output terminal OUT. Further, when only the logic signal $S_3$ is inactive (low), a current of $I_3$ flows through the output terminal OUT. In any case, if $I_1=I_2=I_3=I$, a current of I flows through the output terminal OUT.

In FIG. 7A, when only the logic signals $S_1$ and $S_2$ are inactive (low), a current of $I_1+I_2$ flows through the output terminal OUT. Also, when only the logic signals $S_2$ and $S_3$ are inactive (low), a current of $I_2+I_3$ flows through the output terminal OUT. Further, when only the logic signal $S_3$ and $S_1$ are inactive (low), a current of $I_3+I_1$ flows through the output terminal OUT. In any case, if $I_1=I_2=I_3=I$, a current of 2I flows through the output terminal OUT.

In FIG. 7A, when all the logic signals $S_1$, $S_2$ and $S_3$ are inactive (low), a current of $I_1+I_2+I_3$ flows through the output terminal OUT. In this case, if $I_1=I_2=I_3=I$, a current of 3I flows through the output terminal OUT.

Thus, the D/A converter of FIG. 7A can serve as a 2-bit D/A converter for generating currents of 0, I, 2I and 3I.

Also, in FIG. 7A, assume that $I_1=2^2I$, $I_2=2I$ and $I_3=I$. In this case, when all the signals $S_1$, $S_2$ and $S_3$ are active (high), no current flows through the output terminal OUT. When only the logic signal $S_3$ is inactive (low), a current of I flows through the output terminal OUT. When only the logic signal $S_2$ is inactive (low), a current of 2I flows through the output terminal OUT.

When only the logic signal $S_1$ is inactive (low), a current of 4I flows through the output terminal OUT. Also, when only the logic signals $S_3$ and $S_2$ are inactive (low), a current of 3I flows through the output terminal OUT. When only the logic signals $S_2$ and $S_1$ are inactive (low), a current of 6I flows through the output terminal OUT. When only the logic signals $S_1$ and $S_3$ are inactive (low), a current of 5I flows through the output terminal OUT. Further, when all the logic signals $S_1$, $S_2$ and $S_3$ are inactive (low), a current of 7I flows through the output terminal OUT.

Thus, the D/A converter of FIG. 7A can serve as a 3-bit D/A converter for generating currents of 0, I, 2I, 3I, 4I, 5I, 6I and 7I.

Figure 7B:
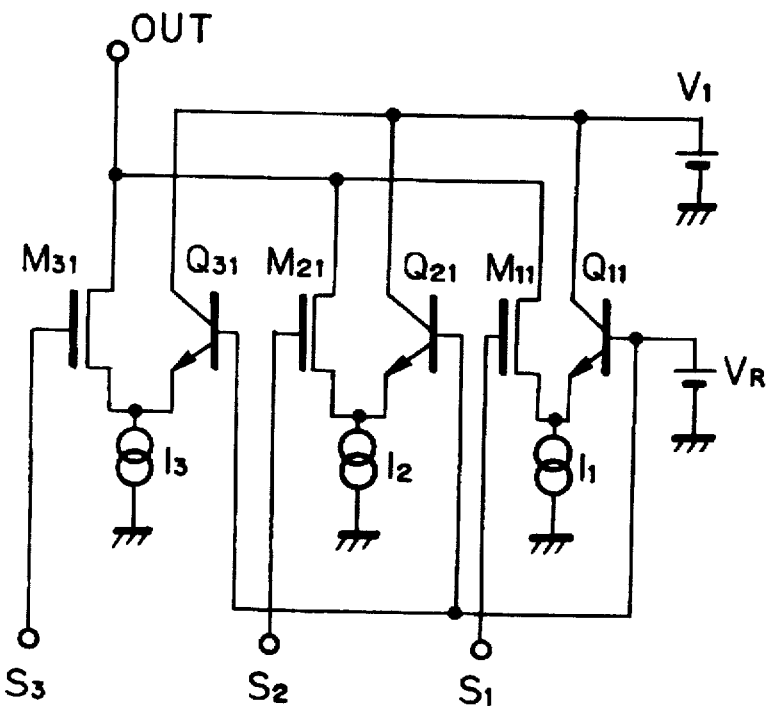

In FIG. 7B illustrates an D/A converter to which the second embodiment as illustrated in FIG. 4 is applied. That is, the collectors of the NPN type transistors $Q_{11}$, $Q_{21}$ and $Q_{31}$ receive the voltage $V_1$, and the drains of the MOS transistors $M_{11}$, $M_{21}$ and $M_{31}$ are connected to the output terminal OUT. The D/A converter of FIG. 7B operates in the same way as that of FIG. 7A.

Figure 7C:
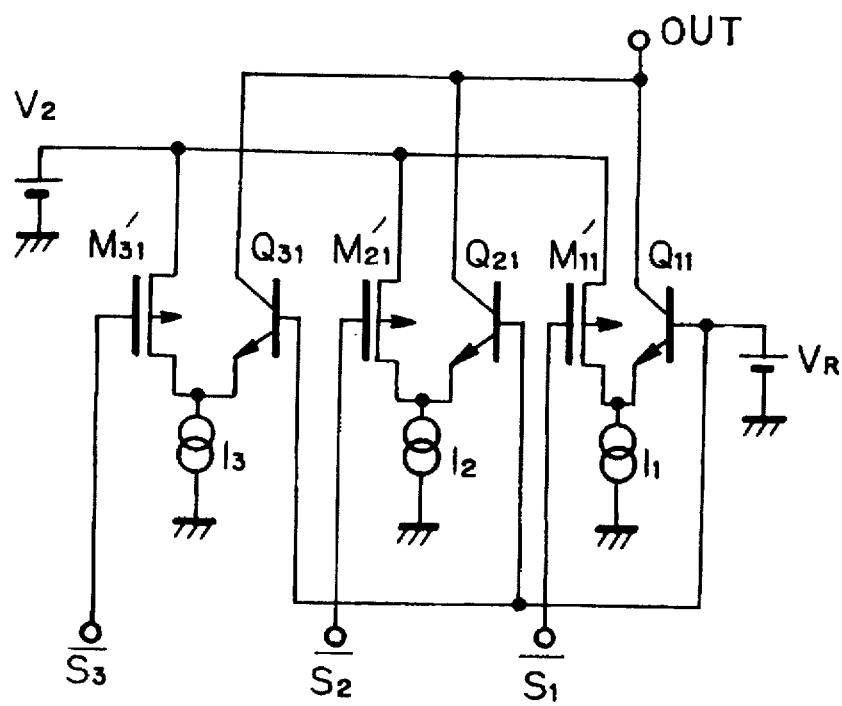

In FIG. 7C illustrates an D/A converter to which the third embodiment as illustrated in FIG. 5 is applied. That is, P-channel MOS transistors $M_{11}'$, $M_{21}'$ and $M_{31}'$ are provided instead of the N-channel MOS transistors $M_{11}$, $M_{21}$ and $M_{31}$, respectively, of FIG. 7A.

In FIG. 7C, when all the logic signals $\overline{S}_1$, $\overline{S}_2$ and $\overline{S}_3$ are active (low), no current flows through the output OUT.

In FIG. 7C, when only the logic signals $\overline{S}_1$ is inactive (high), a current of $I_1$ flows through the output terminal OUT. Also, when only the logic signal $\overline{S}_2$, is inactive (high), a current of $I_2$ flows through the output terminal OUT. Further, when only the logic signal $\overline{S}_3$, is inactive (high), a current of $I_3$ flows through the output terminal OUT. In any case, if $I_1=I_2=I_3=I$, a current of I flows through the output terminal OUT.

In FIG. 7C, when only the logic signals $\overline{S}_1$ and $\overline{S}_2$ are inactive (high), a current of $I_1+I_2$ flows through the output terminal OUT. Also, when only the logic signals $\overline{S}_2$ and $\overline{S}_3$ are inactive (high), a current of $I_2+I_3$ flows through the output terminal OUT. Further, when only the logic signals $\overline{S}_3$ and $\overline{S}_1$ are inactive (high), a current of $I_3+I_1$ flows through the output terminal OUT. In any case, if $I_1=I_2=I_3=I$, a current of 2I flows through the output terminal OUT.

In FIG. 7C, when all the logic signals $\overline{S}_1$, $\overline{S}_2$ and $\overline{S}_3$ are inactive (high), a current of $I_1+I_2+I_3$ flows through the output terminal OUT. In this case, if $I_1+I_2=I_3=I$, a current of 3I flows through the output terminal OUT.

Thus, the D/A converter of FIG. 7C also can serve as a 2-bit D/A converter for generating currents of 0, I, 2I and 3I.

Also, in FIG. 7C, assume that $I_1=2^2I$, $I_2=2I$ and $I_3=I$. In this case, when all the signals $\overline{S}_1$, $\overline{S}_2$ and $\overline{S}_3$ are active (low), no current flows through the output terminal OUT. When only the logic signal $\overline{S}_3$ is inactive (high), a current of I flows through the output terminal OUT. When only the logic signal $\overline{S}_2$ is inactive (high), a current of 2I flows through the output terminal OUT. When only the logic signals $\overline{S}_1$ is inactive (high), a current of 4I flows through the output terminal OUT. Also, when only the logic signals $\overline{S}_3$ and $\overline{S}_2$ are inactive (high), a current of 3I flows through the output terminal OUT. When only the logic signals $\overline{S}_2$ and $\overline{S}_1$ are inactive (high), a current of 6I flows through the output terminal OUT. When only the logic signals $\overline{S}_1$ and $\overline{S}_3$ are inactive (high), a current of 5I flows through the output terminal OUT. Further, when all the logic signals $\overline{S}_1$, $\overline{S}_2$ and $\overline{S}_3$ are inactive (high), a current of 7I flows through the output terminal OUT.

Thus, the D/A converter of FIG. 7C also can serve as a 3-bit D/A converter for generating currents of 0, I, 2I, 3I, 4I, 5I, 6I and 7I.

Figure 7D:
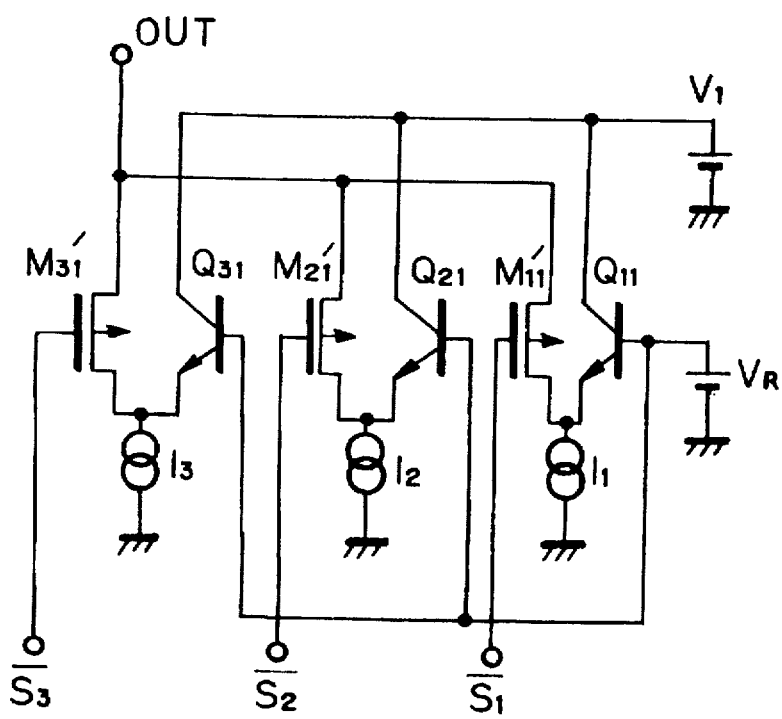

FIG. 7D illustrates a D/A converter to which the fourth embodiment as illustrated in FIG. 6 is applied. That is, the collectors of the NPN type transistors $Q_{11}$, $Q_{21}$ and $Q_{31}$ receive the voltage $V_1$, and the sources of the MOS transistors $M_{11}'$, $M_{21}'$ and $M_{31}'$ are connected to the output terminal OUT. The D/A converter of FIG. 7D operates in the same way as that of FIG. 7C.

In FIGS. 7A, 7B, 7C and 7D, the logic signals $S_1$, $S_2$ and $S_3$ ($\overline{S}_1$, $\overline{S}_2$ and $\overline{S}_3$) are supplied directly to the MOS transistors $M_{11}$, $M_{21}$ and $M_{31}$ ($M_{11}'$, $M_{21}'$ and $M_{31}'$), and therefore, level shifters such as the level shifters 2-1, 2-2 and 2-3 of FIG. 2 are unnecessary. Also, other N-stage (N≧4) D/A converters can be easily realized. For example, if eleven stages whose current sources are I, 2I, 4I, 8I, 16I, 16I, 16I, 16I, 16I, 16I, and 16I are used, an 11-bit D/A converter for generating a current of I to 127I can be realized.

Figure 8A:
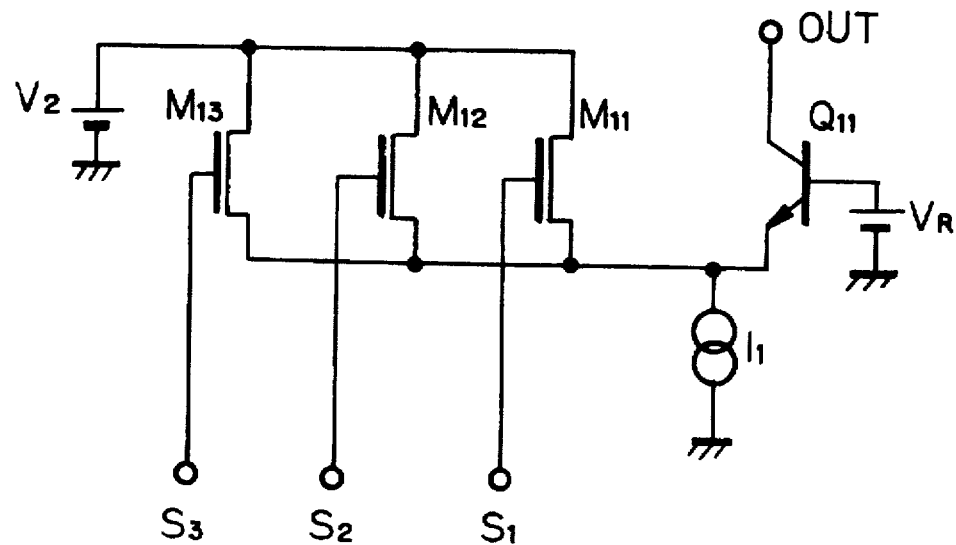
FIGS. 8A, 8B, 8C and 8D are circuit diagrams illustrating an OR circuit to which the present invention is applied.

FIG. 8A illustrates an OR circuit to which the first embodiment as illustrated in FIG. 3 is applied. That is, a current switch formed by an NPN type transistor $Q_{11}$, an N-channel MOS transistor $M_{11}$ and a constant current source $I_1$, a current switch formed by the NPN type transistor $Q_{11}$, an N-channel MOS transistor $M_{21}$ and the constant current source $I_1$, a current switch formed by the NPN type transistor $Q_{11}$, an N-channel MOS transistor $M_{13}$ and a constant current source $I_1$, are provided. A collector of the NPN type transistor $Q_{11}$ is connected to an output terminal OUT, and a base of the NPN transistor $Q_{11}$ receives a reference voltage $V_R$. On the other hand, drains of the MOS transistors $M_{11}$, $M_{12}$ and $M_{13}$ receives a voltage $V_2$, and gates of the MOS transistors $M_{11}$, $M_{12}$ and $M_{13}$ receive logic signals $S_1$, $S_2$ and $S_3$, respectively.

In FIG. 8A, when all the logic signals $S_1$, $S_2$ and $S_3$ are inactive (low), a current of $I_1$ flows through the output OUT.

In FIG. 8A, when one of the logic signals $S_1$, $S_2$ and $S_3$ is active (high), current of $I_1$ flows through the output terminal OUT.

Figure 8B:
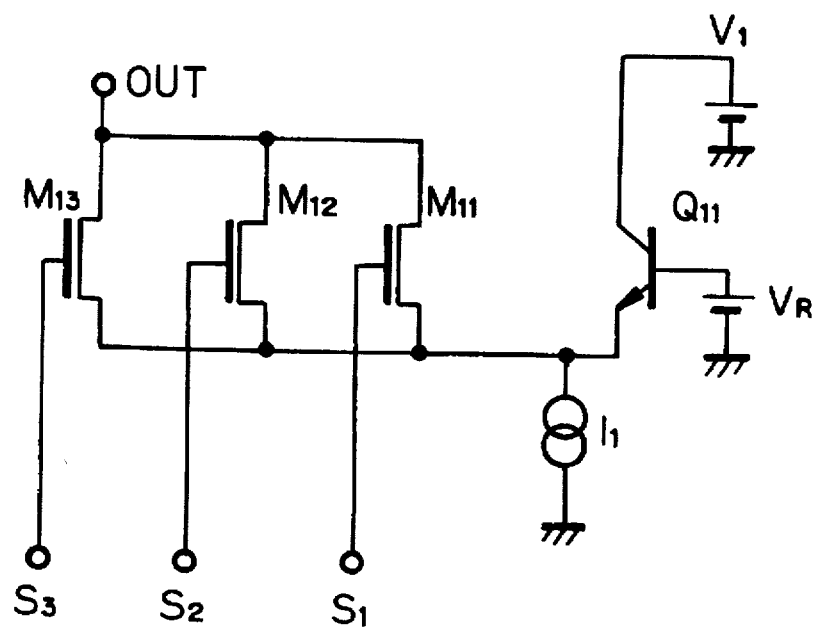

FIG. 8B illustrates an OR circuit to which the second embodiment as illustrated in FIG. 4 is applied. That is, the collector of the NPN type transistor $Q_{11}$ receives the voltage $V_1$, and the drains of the MOS transistors $M_{11}$, $M_{12}$ and $M_{13}$ are connected to the output terminal OUT. The OR circuit of FIG. 8B operates in the same way as that of FIG. 8A.

Figure 8C:
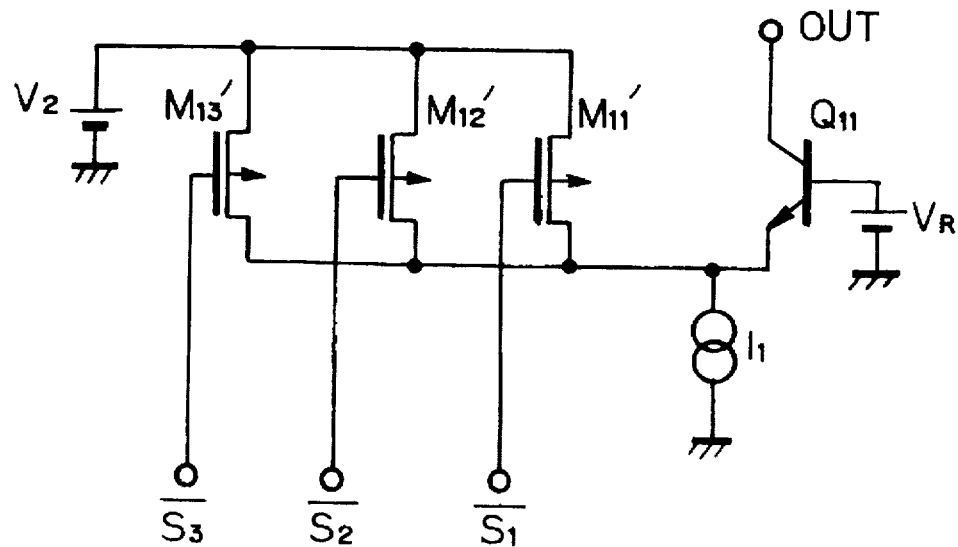

FIG. 8C illustrates an OR circuit to which the third embodiment as illustrated in FIG. 5 is applied. That is, a P-channel MOS transistors $M_{11}'$, $M_{12}'$ and $M_{13}'$ are provided instead of the N-channel MOS transistors $M_{11}$, $M_{21}$ and $M_{31}$, respectively, of FIG. 8A.

In FIG. 8C, when all the logic signals $\overline{S}_1$, $\overline{S}_2$ and $\overline{S}_3$ are inactive (high), a current of $I_1$ flows through the output OUT.

In FIG. 8C, when one of the logic signals $\overline{S}_1$, $\overline{S}_2$ and $\overline{S}_3$ is active (low), no current flows through the output terminal OUT.

Figure 8D:
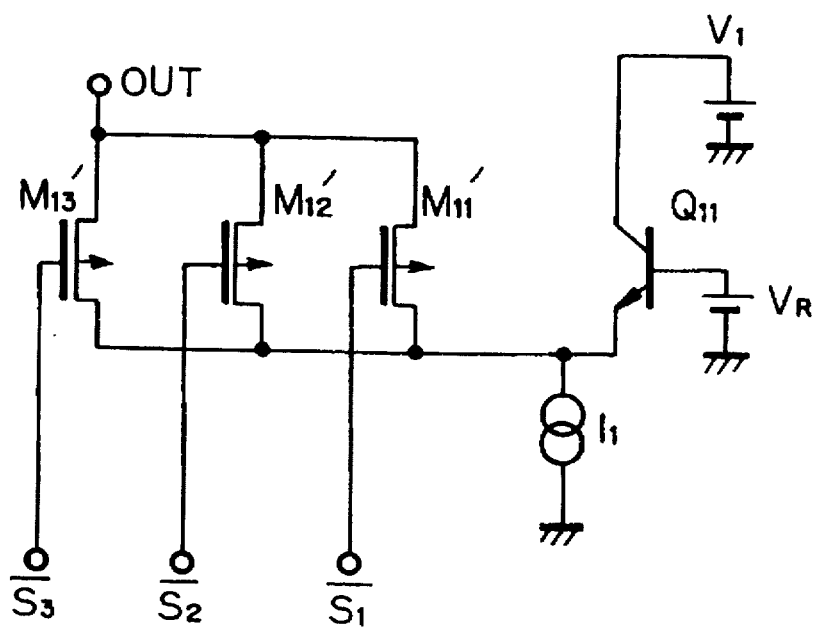

FIG. 8D illustrates an OR circuit to which the fourth embodiment as illustrated in FIG. 6 is applied. That is, the collector of the NPN type transistor $Q_{11}$ receives the voltage $V_1$, and the sources of the MOS transistors $M_{11}$, $M_{21}$ and $M_{31}$ are connected to the output terminal OUT. The OR circuit of FIG. 8D operates in the same way as that of FIG. 8C.

Also, in FIGS. 8A, 8B, 8C and 8D, the logic signals $S_1$, $S_2$ and $S_3$ ($\overline{S}_1$, $\overline{S}_2$ and $\overline{S}_3$) are supplied directly to the MOS transistors $M_{11}$, $M_{21}$ and $M_{31}$ ($M_{11}'$, $M_{12}'$ and $M_{13}'$), and therefore, level shifters such as the level shifters 2-1, 2-2 and 2-3 of FIG. 2 are unnecessary. Also, other three or more bit OR circuits can be easily realized.

Figure 9A:
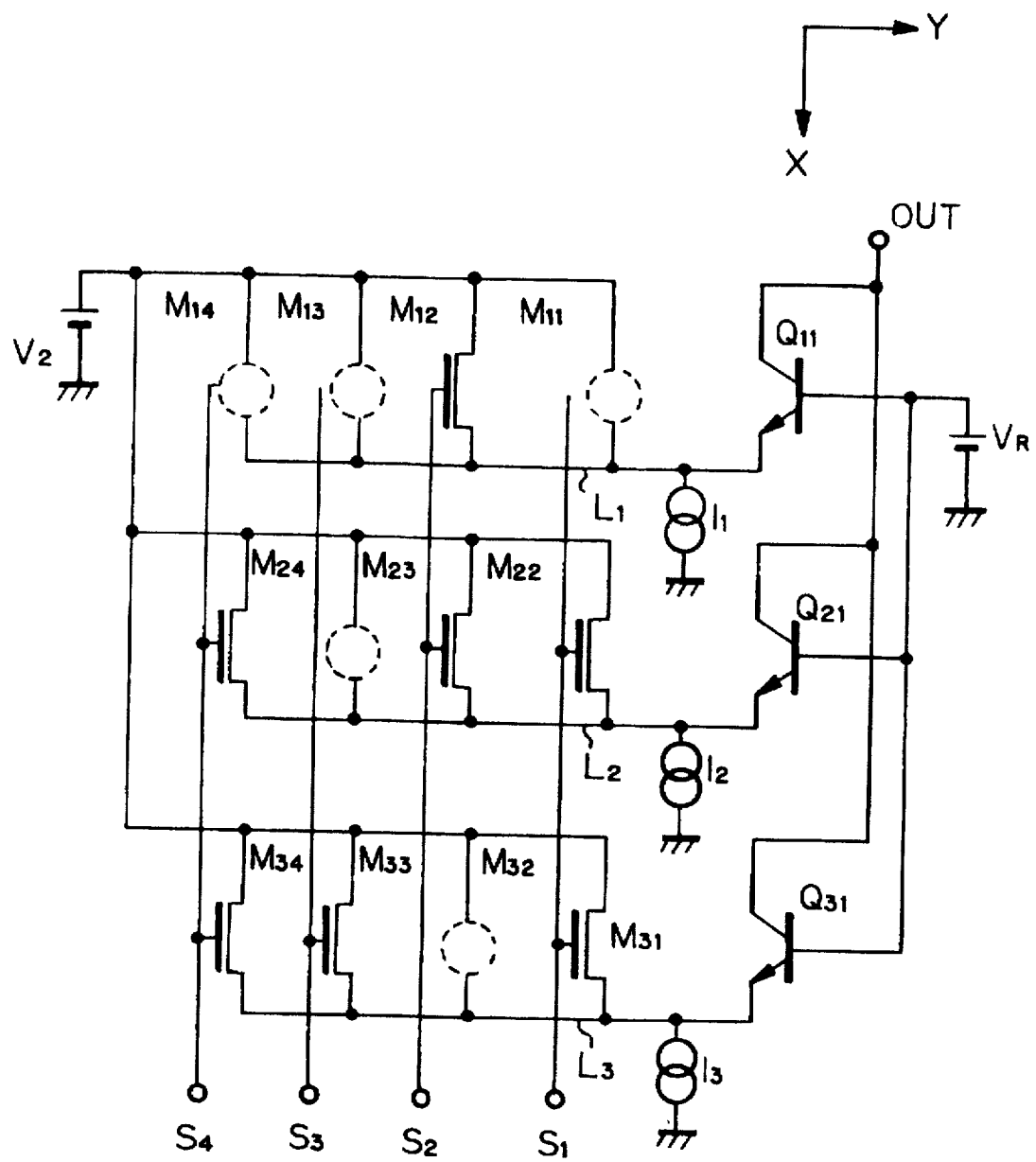
FIG. 9A is a circuit diagram illustrating a fifth embodiment of the current switch apparatus according to the present invention.

In FIG. 9A, which illustrates a fifth embodiment of the present invention, the circuit of FIG. 2 is realized without the level shift circuit 2 of FIG. 2. That is, NPN type transistors $Q_{11}$, $Q_{21}$ and $Q_{31}$ are arranged along an X direction. Collectors of the NPN type transistors $Q_{11}$, $Q_{21}$ and $Q_{31}$ are connected to an output terminal OUT, and bases of the NPN type transistors $Q_{11}$, $Q_{21}$ and $Q_{31}$ receive a reference voltage $V_R$. Emitters of the NPN type transistors $Q_{11}$, $Q_{21}$ and $Q_{31}$ are connected to constant current sources $I_1$, $I_2$ and $I_3$, respectively, and to conductive lines $L_1$, $L_2$ and $L_3$, respectively, arranged along a Y direction.

Also, a row of N-channel MOS transistors $M_{11}$, $M_{12}$, $M_{13}$ and $M_{14}$ are provided between a terminal for a voltage $V_2$ and the conductive line $L_1$. A row of N-channel MOS transistors $M_{21}$, $M_{22}$, $M_{23}$ and $M_{24}$ are provided between the terminal for the voltage $V_2$ and the conductive line $L_2$. A row of N-channel MOS transistors $M_{31}$, $M_{32}$, $M_{33}$ and $M_{34}$ are provided between the terminal for the voltage $V_2$ and the conductive line $L_3$.

A column of the MOS transistors $M_{11}$, $M_{21}$ and $M_{31}$ is controlled by a logic signal $S_1$. A column of the MOS transistors $M_{12}$, $M_{22}$ and $M_{32}$ is controlled by a logic signal $S_2$. A column of the MOS transistors $M_{13}$, $M_{23}$ and $M_{33}$ is controlled by a logic signal $S_3$. A column of the MOS transistors $M_{14}$, $M_{24}$ and $M_{34}$ is controlled by a logic signal $S_4$.

In FIG. 9A, the MOS transistors $M_{11}$, $M_{13}$, $M_{14}$, $M_{23}$ and $M_{32}$ are actually absent, which is explained with reference to FIGS. 9B and 9C. Note that FIG. 9B is a plan view of the circuit of FIG. 9A, and FIG. 9C is a cross-sectional view taken along the line IX—IX of FIG. 9B.

Figure 9B:
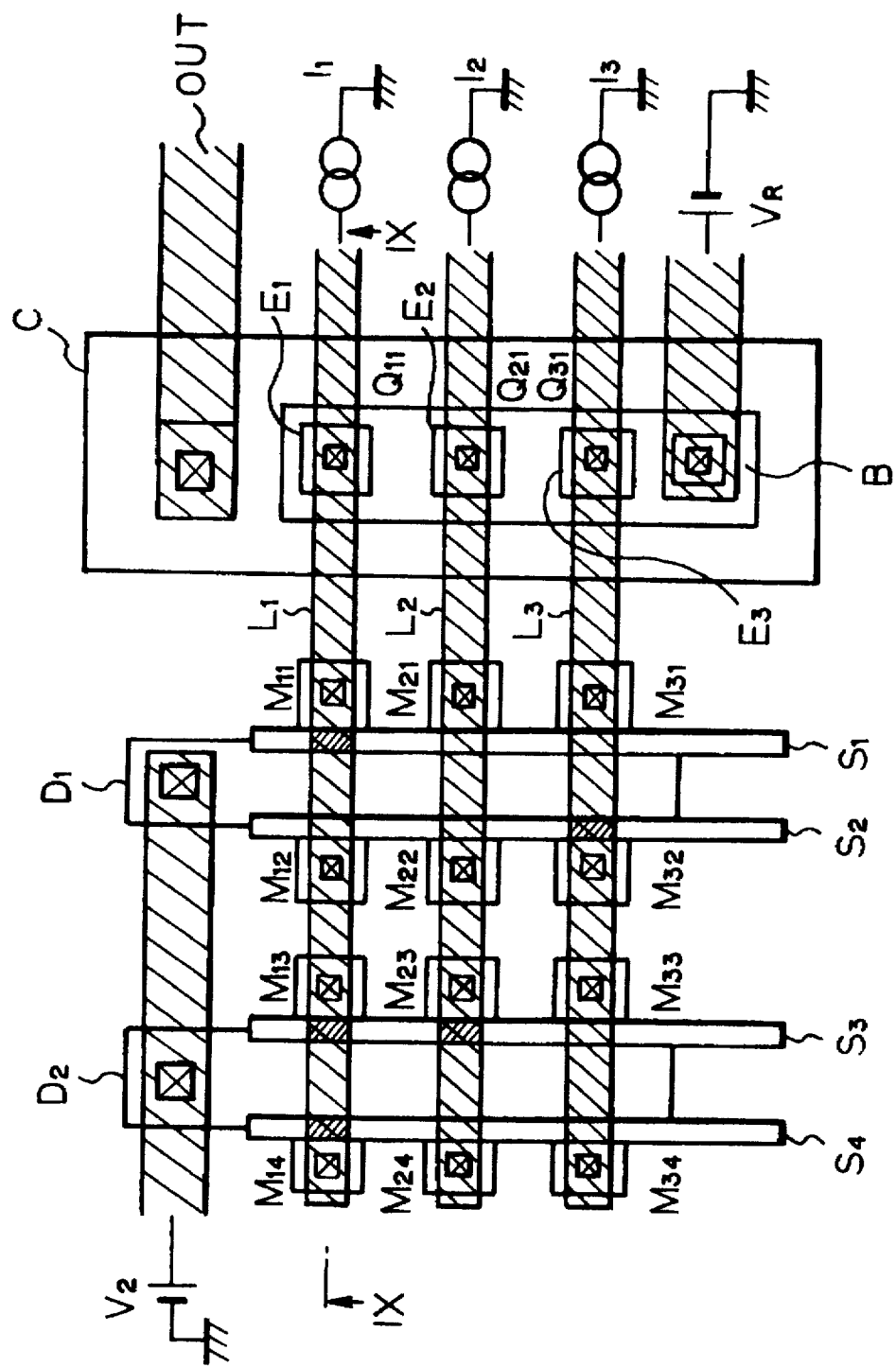
FIG. 9B is a plan view of the circuit of FIG. 9A.
Figure 9C:
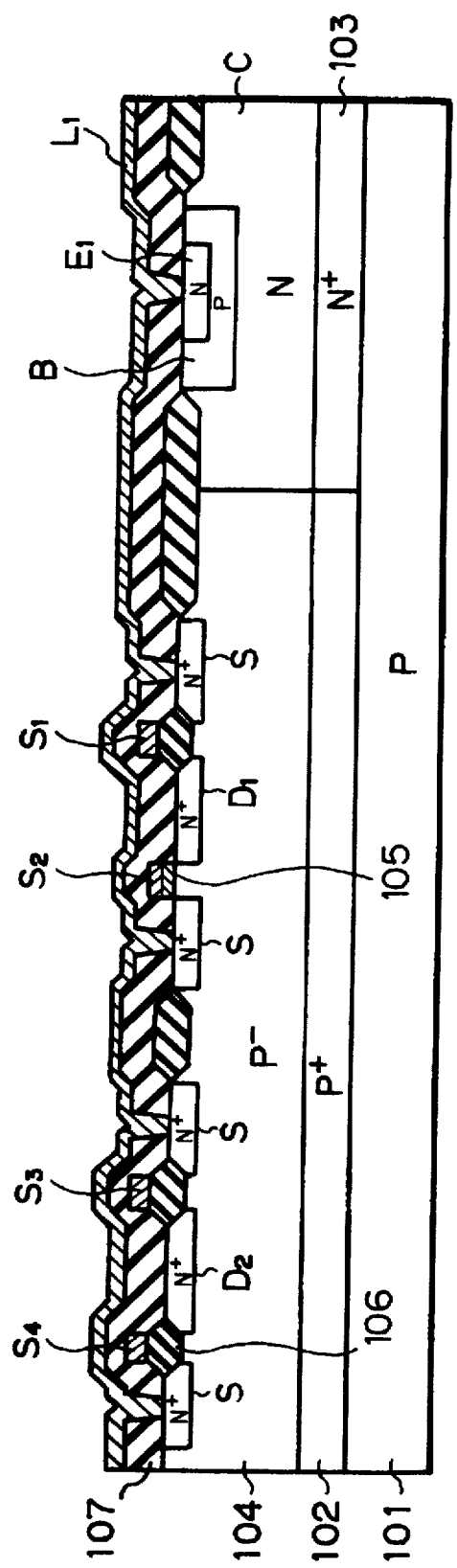
FIG. 9C is a cross-sectional view taken along the line IX—IX Of FIG. 9B.

In FIGS. 9B and 9C, a $P^+$-type buried layer 102 for a MOS transistor area and an $N^+$-type buried layer 103 for a bipolar transistor area are formed on a P-type semiconductor substrate 101.

Provided on the $P^+$-type buried layer 102 is a $P^-$-type semiconductor layer 104 having $N^+$-type impurity diffusion regions for source regions S and drain regions $D_1$ and $D_2$. The $N^+$-type impurity diffusion regions are separated by a gate insulating layer 105 and a field insulating layer 106. Also, gate electrodes for the logic signal $S_1$, $S_2$, $S_3$ and $S_4$ are formed on the gate insulating layer 105 and the field insulating layer 106. Also, an insulating layer 107 is provided on the entire surface, and a conductive layer is provided for the conductive line $L_1$. In FIG. 9C, the gate electrodes for the logic signals $S_1$, $S_3$ and $S_4$ are formed on the field insulating layer 106, so that the threshold voltages of the MOS transistors $M_{11}$, $M_{13}$ and $M_{14}$ are extremely high. This means that the MOS transistors $M_{11}$, $M_{13}$ and $M_{14}$ are substantially not present.

On the other hand, provided on the $N^+$-type buried layer 103 is a common collector region C and a common base region B for the NPN type transistors $Q_{11}$, $Q_{21}$ and $Q_{31}$. Also, emitter regions $E_1$, $E_2$ and $E_3$ for the NPN type transistors $Q_{11}$, $Q_{21}$ and $Q_{31}$ are formed within the common base region B.

Figure 10A:
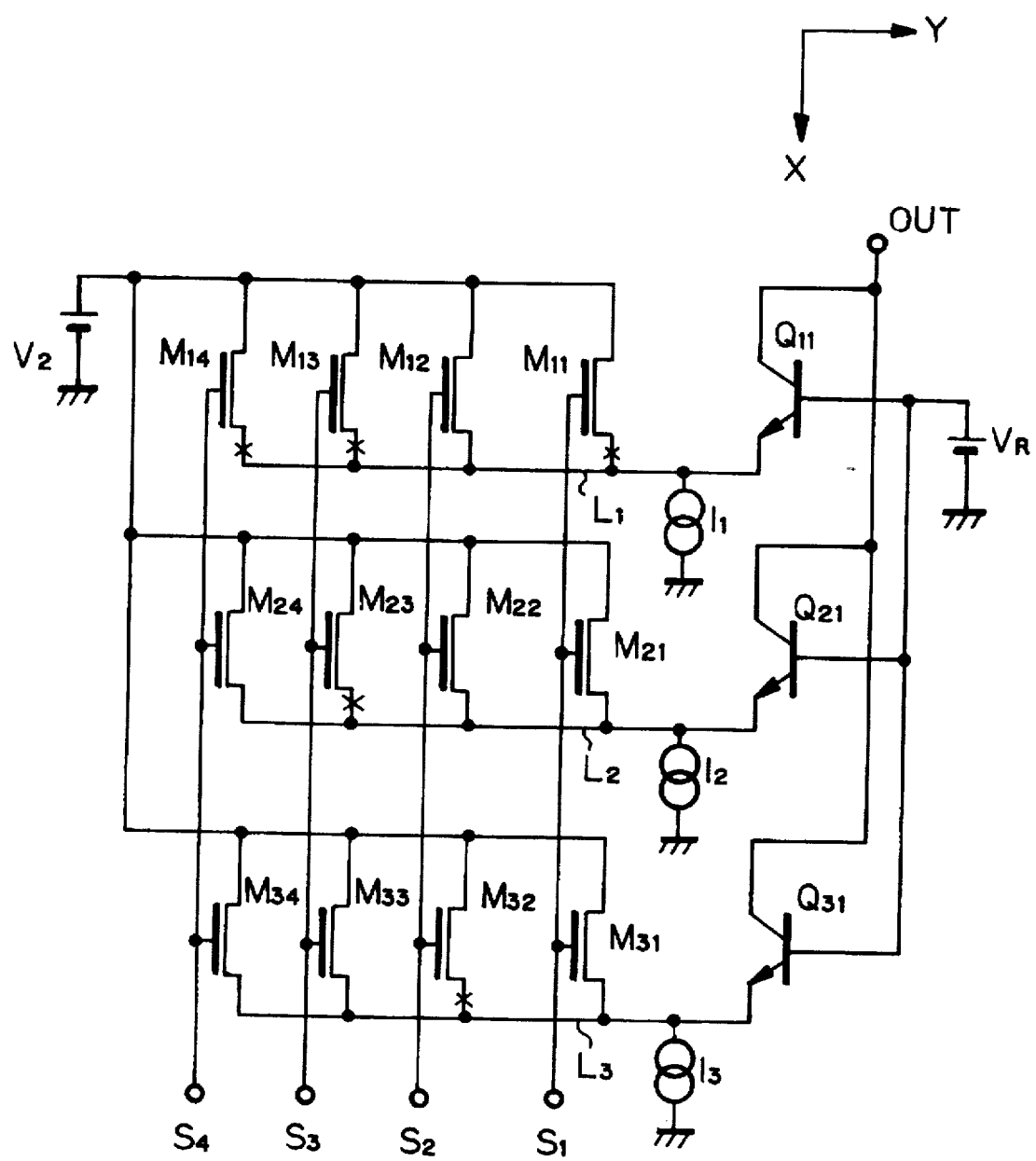
FIG. 10A is a circuit diagram illustrating a sixth embodiment of the current switch apparatus according to the present invention.

In FIG. 10A, which illustrates a sixth embodiment of the present invention, the circuit of FIG. 2 is also realized without the level shift circuit 2 of FIG. 2.

Also, in FIG. 10A, the MOS transistors $M_{11}$, $M_{13}$, $M_{14}$, $M_{23}$ and $M_{32}$ are actually absent, which is explained with reference to FIGS. 10B and 10C. Note that FIG. 10B is a plan view of the circuit of FIG. 10A, and FIG. 10C is a cross-sectional view taken along the line X—X of FIG. 10B.

Figure 10B:
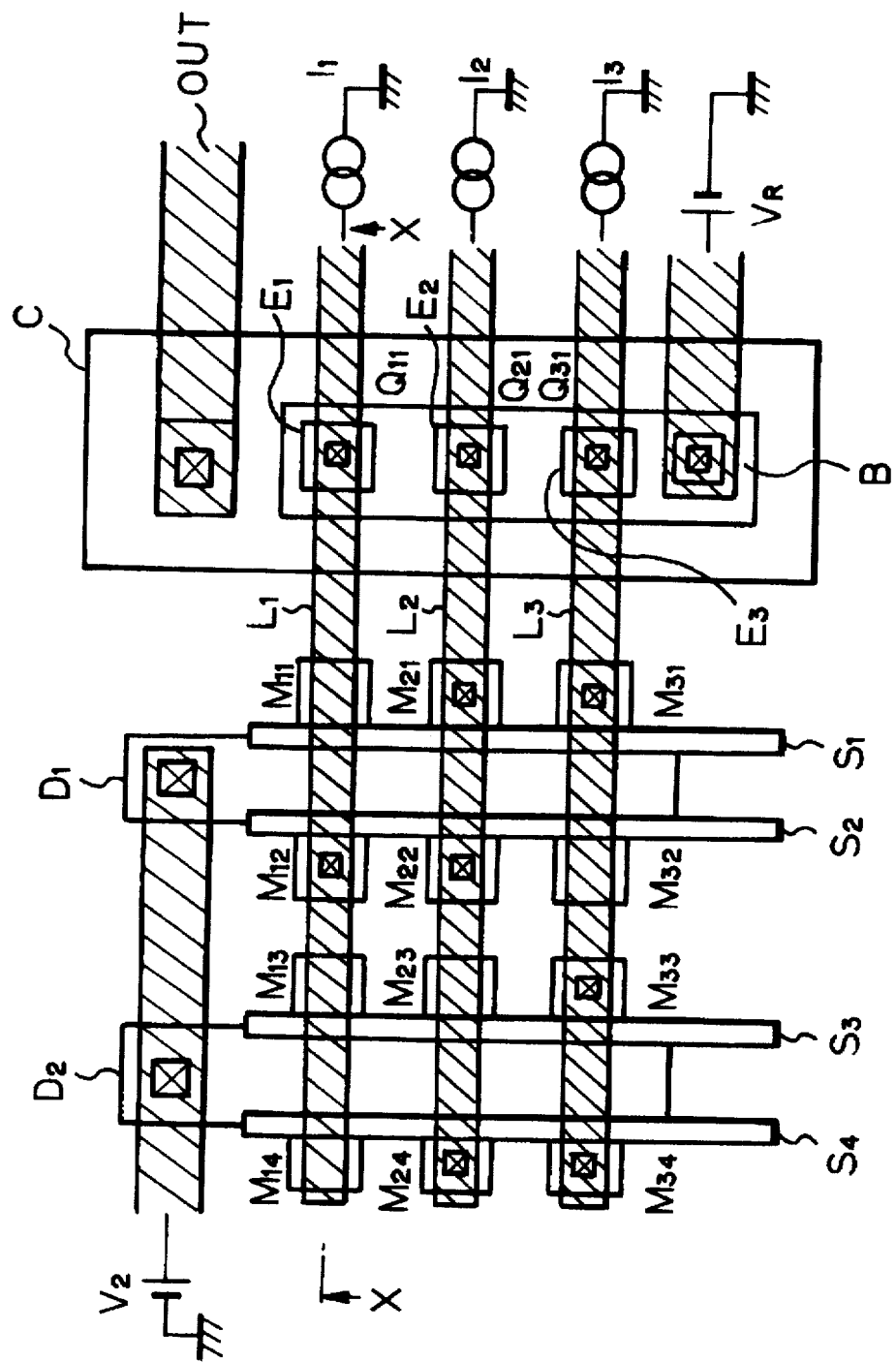
FIG. 10B is a plan view of the circuit of FIG. 10A.
Figure 10C:
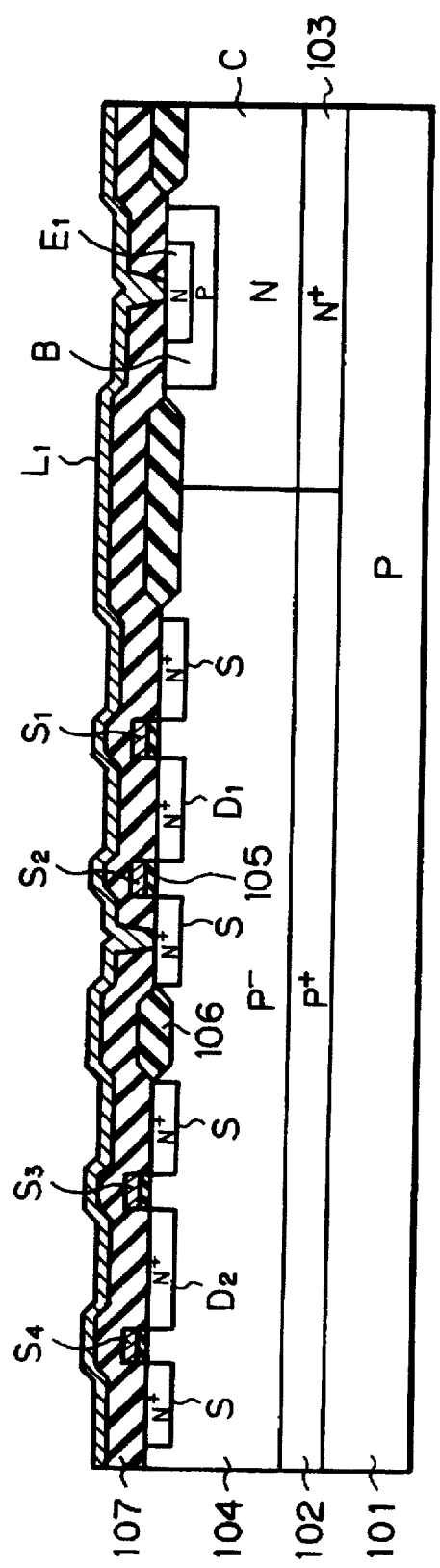
FIG. 10C is a cross-sectional view taken along the line X—X of FIG. 10B.

In FIGS. 10B and 10C, all the gate electrodes for the logic signal $S_1$, $S_2$, $S_3$ and $S_4$ are formed on the gate insulating layer 105. However, contact holes between the conductive layer for the conductive line $L_1$ and the source regions S of the MOS transistors $M_{11}$, $M_{13}$ and $M_{14}$ are not provided. Also, this means that the MOS transistors $M_{11}$, $M_{13}$ and $M_{14}$ are substantially not present.

Figure 11A:
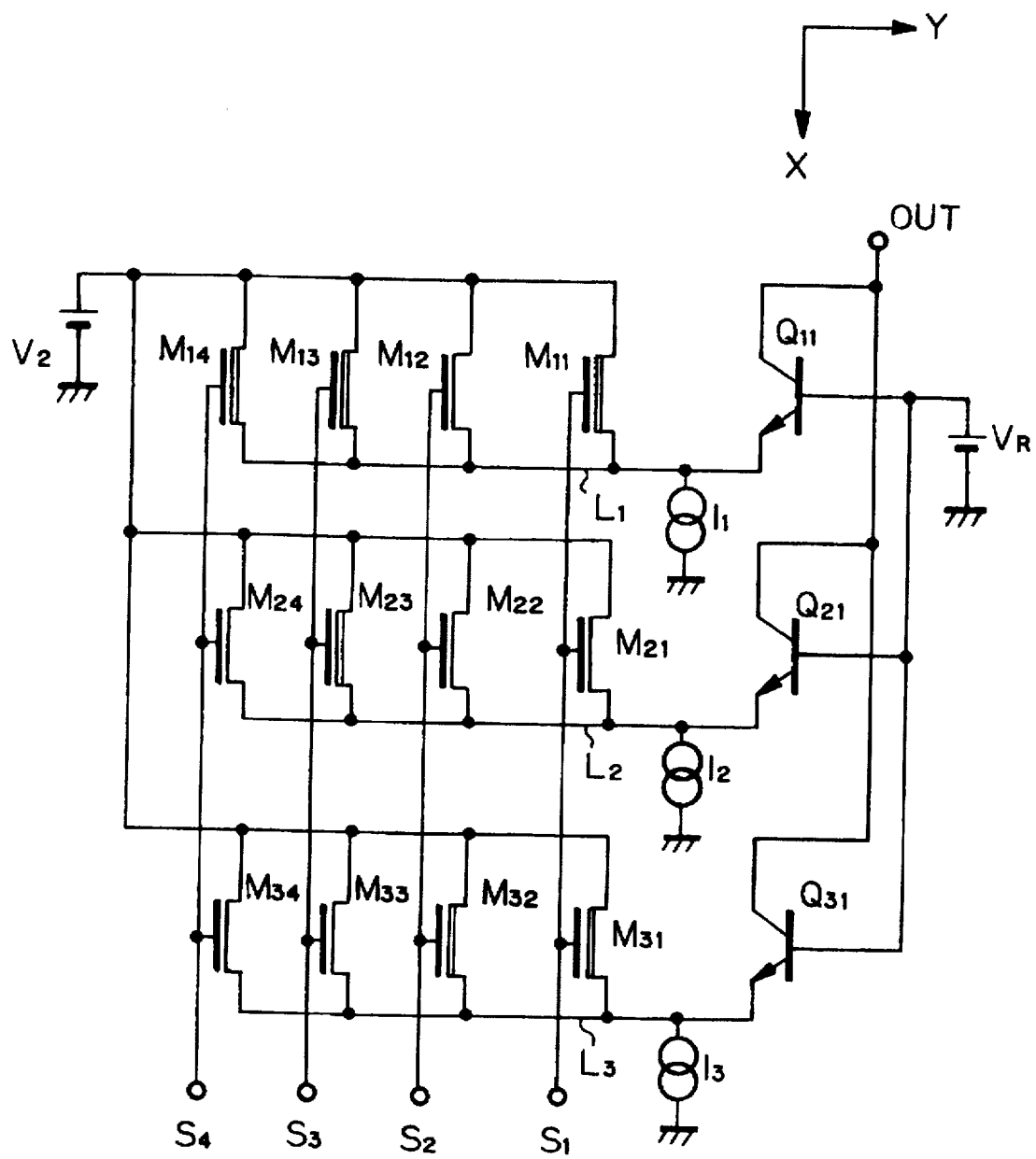
FIG. 11A is a circuit diagram illustrating a seventh embodiment of the current switch apparatus according to the present invention.

In FIG. 11A, which illustrates a seventh embodiment of the present invention, the circuit of FIG. 2 is also realized without the level shift circuit 2 of FIG. 2.

Also, in FIG. 11A, the MOS transistors $M_{11}$, $M_{13}$, $M_{14}$, $M_{23}$ and $M_{32}$ are actually absent, which is explained with reference to FIGS. 11B and 11C. Note that FIG. 11B is a plan view of the circuit of FIG. 11A, and FIG. 11C is a cross-sectional view taken along the line XI—XI of FIG. 11B.

Figure 11C:
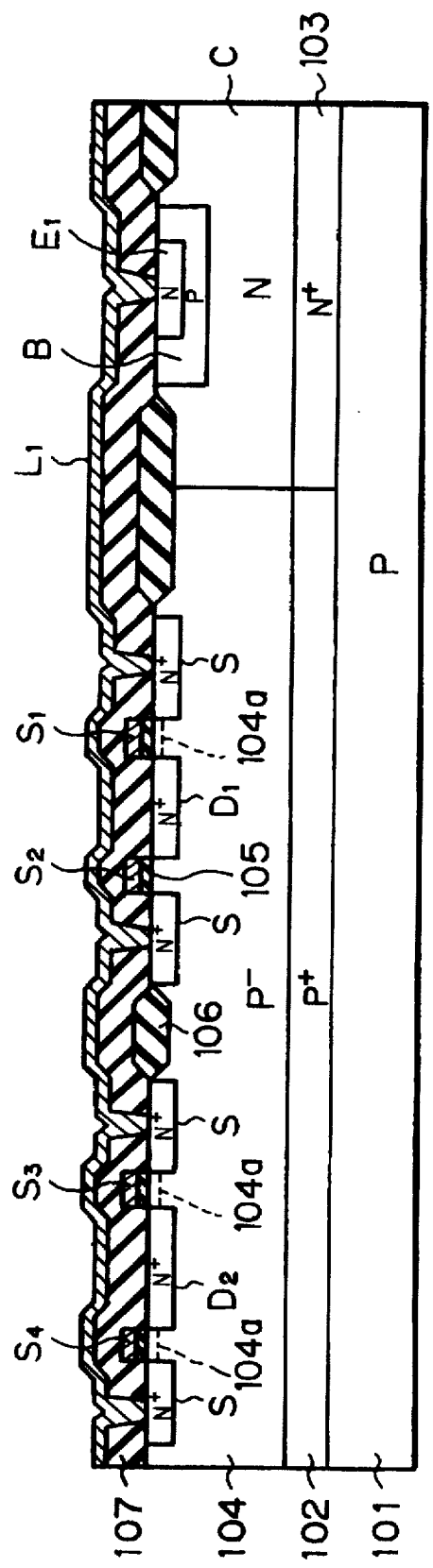
FIG. 11C is a cross-sectional view taken along the line XI—XI of FIG. 11B.

In FIGS. 11B and 11C, all the gate electrodes for the logic signal $S_1$, $S_2$, $S_3$ and $S_4$ are formed on the gate insulating layer 105. Also, contact holes between the conductive layer for the conductive line $L_1$ and the source regions S of the MOS transistors $M_{11}$, $M_{13}$ and $M_{14}$ are provided. However, boron ions are implanted into the $P^-$-type semiconductor layer 104 beneath the gate electrodes for the logic signals $S_1$, $S_3$ and $S_4$. As a result, the threshold voltages of the MOS transistors $M_{11}$, $M_{12}$, $M_{13}$ and $M_{14}$ are extremely high. This means that the MOS transistors $M_{11}$, $M_{13}$ and $M_{14}$ are substantially not present.

In the above-described fifth, sixth and seventh embodiments, since the circuit of FIG. 2 is realized without the level shift circuit, the integration can be improved. Also, since the collector region C and the base region B are common for the NPN type transistors $Q_{11}$, $Q_{21}$ and $Q_{31}$, the area of the circuit can be reduced, thus also improving the integration.

As explained hereinbefore, according to the present invention, since a current switch apparatus uses a MOS transistor capable of directly receiving a logic signal, a level shift circuit is unnecessary to thereby reduce the size of the apparatus, i.e., improve the integration. Also, the manufacturing cost can be reduced.

I claim:

1. A current switch apparatus comprising:
   a logic signal input terminal;

an output terminal;

a power supply terminal;

a reference voltage terminal;

a bipolar transistor having a collector connected to said output terminal, a base connected to said reference voltage terminal, and an emitter;

a MOS transistor, connected between said power supply voltage terminal and the emitter of said bipolar transistor and having a gate connected to said logic signal input terminal; and a constant current source connected to the emitter of said bipolar transistor, wherein said MOS transistor is of an N-channel type.

2. An apparatus as set forth in claim 1, wherein when a voltage at said logic signal input terminal is at a first level, said MOS transistor is turned ON so that said bipolar transistor is turned OFF, and wherein when the voltage at said logic signal input terminal is at a second level, said MOS transistor is turned OFF so that said bipolar transistor is turned ON.

3. A current switch apparatus comprising:

a logic signal input terminal;

an output terminal;

a power supply terminal;

a reference voltage terminal;

a bipolar transistor having a collector connected to said power supply terminal, a base connected to said reference voltage terminal, and an emitter;

a MOS transistor, connected between said output terminal and the emitter of said bipolar transistor and having a gate connected to said logic signal input terminal; and a constant current source connected to the emitter of said bipolar transistor, wherein said MOS transistor is of an N-channel type.

4. An apparatus as set forth in claim 3, wherein when a voltage at said logic signal input terminal is at a first level, said MOS transistor is turned ON so that said bipolar transistor is turned OFF, and wherein when the voltage at said logic signal input terminal is at a second level, said MOS transistor is turned OFF so that said bipolar transistor is turned ON.

5. A current switch apparatus comprising:

a plurality of logic signal input terminals;

an output terminal;

a power supply terminal;

a reference voltage terminal;

a plurality of bipolar transistors, each having a collector connected to said output terminal, a base connected to said reference voltage terminal, and an emitter;

a plurality of MOS transistors, each being connected between said power supply terminal and the emitter of one of said bipolar transistors and having a gate connected to one of said logic signal input terminals; and a plurality of constant current sources each connected to the emitter of one of said bipolar transistors.

6. An apparatus a set forth in claim 5, wherein said MOS transistors are of an N-channel type.

7. An apparatus as set forth in claim 5, wherein said MOS transistors are of a P-channel type.

8. An apparatus as set forth in claim 5, wherein when a voltage at one of said logic signal input terminals is at a first level, a respective one of said MOS transistors is turned ON so that a respective one of said bipolar transistors is turned OFF, and wherein when the voltage at one of said logic signal input terminals is at a second level, a respective one of said MOS transistors is turned OFF so that a respective one of said bipolar transistors is turned ON.

9. An apparatus as set forth in claim 5, wherein said constant current sources have the same current flowing therethrough.

10. An apparatus as set forth in claim 5, wherein a ratio of currents flowing through said constant current sources is $1:2:2_2\ldots$.

11. A current switch apparatus comprising:

a plurality of logic signal input terminals;

an output terminal;

a power supply terminal;

a reference voltage terminal;

a plurality of bipolar transistors, each having a collector connected to said power supply terminal, a base connected to said reference voltage terminal, and an emitter;

a plurality of MOS transistors, each being connected between said output terminal and the emitter of one of said bipolar transistors and having a gate connected to one of said logic signal input terminals; and a plurality of constant current sources each connected to the emitter of one of said bipolar transistors.

12. An apparatus as set forth in claim 11, wherein said MOS transistors are of an N-channel type.

13. An apparatus as set forth in claim 11, wherein said MOS transistors are of a P-channel type.

14. An apparatus as set forth in claim 11, wherein when voltage at one of said logic signal input terminals is at a first level, a respective one of said MOS transistors is turned ON so that a respective one of said bipolar transistors is turned OFF, and wherein when the voltage at one of said logic signal input terminals is at a second level, a respective one of said MOS transistors is turned OFF so that a respective one of said bipolar transistors is turned ON.

15. An apparatus as set forth in claim 11, wherein said constant current sources have the same current flowing therethrough.

16. An apparatus as set forth in claim 11, wherein a ratio of currents flowing through said constant current sources is $1:2:2_2\ldots$.

17. A current switch apparatus comprising:

a plurality of logic signal input terminals;

an output terminal;

a power supply voltage terminal;

a reference voltage terminal;

a bipolar transistor having a collector connected to said output terminal, a base connected to said reference voltage terminal, and an emitter;

a plurality of MOS transistors, being connected between said power supply terminal and the emitter of said bipolar transistor and having a gate connected to one of said logic signal input terminals; and a constant current source connected to the emitter of said bipolar transistor.

18. An apparatus as set forth in claim 17, wherein said MOS transistors are of an N-channel type.

19. An apparatus as set forth in claim 17, wherein said MOS transistors are of a P-channel type.

20. An apparatus as set forth in claim 17, wherein when a voltage at one of said logic signal input terminals is at a first level, a respective one of said MOS transistors is turned ON so that said bipolar transistor is turned OFF, and wherein when voltages at all of said logic signal input terminals are at a second level, all of said MOS transistors are turned OFF so that said bipolar transistor is turned ON.

21. A current switch apparatus comprising:

a plurality of logic signal input terminals;

an output terminal;

a power supply voltage terminal;

a reference voltage terminal;

a bipolar transistor having a collector connected to said output terminal, a base connected to said reference voltage terminal, and an emitter;

a plurality of MOS transistors, being connected between said output terminal and the emitter of said bipolar transistor and having a gate connected to one of said logic signal input terminals; and a constant current source connected to the emitter of said bipolar transistor.

22. An apparatus as set forth in claim 21, wherein said MOS transistors are of an N-channel type.

23. An apparatus as set forth in claim 21, wherein said MOS transistors are of a P-channel type.

24. An apparatus as set forth in claim 21, wherein when a voltage at one of said logic signal input terminals is at a first level, a respective one of said MOS transistors is turned ON so that said bipolar transistor is turned OFF, and wherein when voltages at all of said logic signal input terminals are at a second level, all of said MOS transistors are turned OFF so that said bipolar transistor is turned ON.

25. A current switch apparatus comprising:

plurality of logic signal input terminals;

an output terminal a power supply terminal;

a reference voltage terminal;

a column of bipolar transistors, having collectors connected to said output terminal bases connected to said reference voltage terminal and emitters;

a column of constant current sources each connected to one of the emitters of said bipolar transistors;

a plurality of first conductive line each connected to one of said constant current sources; and a plurality of rows of MOS transistors, each row of said MOS transistors being connected between said power supply terminal and one of said conductive line, gates of each column of said MOS transistors being connected to one of said logic signal terminals.

26. An apparatus as set forth in claim 25, wherein a certain number of said MOS transistors are always turned OFF regardless of a voltage applied to respective logic signal input terminals.

27. An apparatus as set forth in claim 25, further comprising a semiconductor substrate means divided into a bipolar transistor area and a MOS transistor area.

28. An apparatus as set forth in claim 27, further comprising:

a common collector region of said bipolar transistors formed within said semiconductor substrate means in said bipolar transistor area;

a common base region of said bipolar transistors formed within said common collector region; and a plurality of emitter regions each for one of said bipolar transistors, formed within said common base region.

29. An apparatus as set forth in claim 27, further comprising:

a plurality of first impurity regions formed within said semiconductor substrate means in said MOS transistor area, each of said first impurity regions being for one group of a group of sources and a group of drains of said MOS transistors;

a plurality of columns of second impurity regions formed within said semiconductor substrate means in said MOS transistor area, each column being for the other group of the group of sources and the group of drains of said MOS transistors.

30. An apparatus as set forth in claim 29, wherein said columns of second impurity regions are provided for every two columns of said MOS transistors.

31. An apparatus as set forth in claim 29, wherein said first conductive line are selectively connected to said first impurity regions via contact holes.

32. An apparatus as set forth in claim 27, further comprising:

a plurality of second conductive line each connected to one of said logic signal input terminals, said second conductive line serving as gates of said MOS transistors;

an insulating layer formed between said semiconductor substrate in said MOS transistor area and said second conductive line, said insulating layer being thicker in a certain number of said MOS transistors than in the other of said MOS transistors.

33. An apparatus as set forth in claim 27, further comprising:

a plurality of second conductive lines each connected to one of said logic signal input terminals, said second conductive lines respectively serving as gates of said MOS transistors;

an insulating layer formed between said semiconductor substrate in said MOS transistor area and said second conductive lines, a density of impurities on surfaces of said semiconductor substrate beneath said insulating layer being larger in a certain number of said MOS transistors than in the other of said MOS transistors.

* * * * *